United States Patent
Huang et al.

(10) Patent No.: US 10,481,281 B2
(45) Date of Patent: Nov. 19, 2019

(54) RADIATION IMAGE DETECTOR WITH CAPABILITY OF AUTOMATIC EXPOSURE DETECTION (AED) AND AED METHOD

(71) Applicant: Industrial Technology Research Institute, Hsinchu (TW)

(72) Inventors: Jui-Feng Huang, Hsinchu (TW); Chiun-Lung Tsai, New Taipei (TW); Chen-Shiun Chou, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 24 days.

(21) Appl. No.: 15/853,871

(22) Filed: Dec. 25, 2017

(65) Prior Publication Data

US 2019/0187304 A1 Jun. 20, 2019

(30) Foreign Application Priority Data

Dec. 20, 2017 (TW) .............................. 106144753 A (51) Int. Cl.
*G01T 1/24* (2006.01)
*H01L 27/146* (2006.01)
*H04N 5/32* (2006.01)

(52) U.S. Cl.
CPC ........ *G01T 1/241* (2013.01); *H01L 27/14659* (2013.01); *H01L 27/14676* (2013.01); *H04N 5/32* (2013.01)

(58) Field of Classification Search
CPC ............................................... H01L 27/14676
See application file for complete search history.

(56) References Cited

U.S. PATENT DOCUMENTS 3,922,579 A 11/1975 Goto et al.
4,025,815 A 5/1977 Kurokawa et al.
(Continued)

FOREIGN PATENT DOCUMENTS

CN 102792184 11/2012
CN 103126695 6/2013
(Continued)

OTHER PUBLICATIONS

"Office Action of Taiwan Counterpart Application", dated Jul. 6, 2018, p. 1-p. 7.

*Primary Examiner* — Yara B Green
(74) *Attorney, Agent, or Firm* — JCIPRNET (57) ABSTRACT

A radiation image detector with automatic exposure detection includes a high voltage circuit unit for providing an operation bias. An image sensing panel includes semiconductor multi-layer structure, receives the operation bias and senses an incident X-ray, and produces holes and electrons. The holes produce positive charges for forming an image. An automatic exposure detector is coupled to the high voltage circuit unit to transfer the operation bias and detects variation pattern with time of a voltage signal or a current signal induced by the electrons to determine an onset time or a cessation time for exposure. A control unit couples to the high voltage circuit unit, the image sensing panel, and the automatic exposure detector and configured to perform system control, including obtaining an image signal from the image sensing panel. An imaging unit couples to the control unit to process the image signal and display and store the image.

28 Claims, 8 Drawing Sheets

(56) References Cited

U.S. PATENT DOCUMENTS

| | | | |
|---|---|---|---|
| 5,069,935 | A | 12/1991 | Walters et al. |
| 5,751,783 | A | 5/1998 | Granfors et al. |
| 6,171,643 | B1 | 1/2001 | Polischuk et al. |
| 6,404,845 | B1 | 6/2002 | Sharpless et al. |
| 6,797,960 | B1 | 9/2004 | Spartiotis et al. |
| 7,211,803 | B1 | 5/2007 | Dhurjaty et al. |
| 7,608,833 | B2 | 10/2009 | Irisawa et al. |
| 7,692,157 | B2 | 4/2010 | Rougeot et al. |
| 7,723,692 | B2 | 5/2010 | Miyake et al. |
| 7,939,814 | B2 | 5/2011 | Imai |
| 9,031,197 | B2 | 5/2015 | Spahn |
| 9,348,034 | B2 | 5/2016 | Tredwell et al. |
| 9,451,182 | B2 | 9/2016 | Lee et al. |
| 2005/0056829 | A1 | 3/2005 | Green et al. |
| 2008/0292056 | A1* | 11/2008 | Marar .................. A61B 6/10 378/98 |
| 2010/0253616 | A1 | 10/2010 | Omi et al. |
| 2014/0086391 | A1* | 3/2014 | Ohta ................ A61B 6/4233 378/91 |
| 2014/0230900 | A1* | 8/2014 | Cull .................. H01L 51/0007 136/263 |
| 2017/0077429 | A1* | 3/2017 | Huang ................ H01L 51/426 |

FOREIGN PATENT DOCUMENTS

| | | |
|---|---|---|
| CN | 101952981 | 12/2013 |
| CN | 104124256 | 10/2014 |
| TW | 200917472 | 4/2009 |
| TW | 201532261 | 8/2015 |
| TW | I527256 | 3/2016 |
| WO | 2006076788 | 7/2006 |
| WO | 2017063159 | 4/2017 |

* cited by examiner

RADIATION IMAGE DETECTOR WITH CAPABILITY OF AUTOMATIC EXPOSURE DETECTION (AED) AND AED METHOD

CROSS-REFERENCE TO RELATED APPLICATION

This application claims the priority benefit of Taiwan application serial no. 106144753, filed on Dec. 20, 2017. The entirety of the above-mentioned patent application is hereby incorporated by reference herein and made a part of this specification.

BACKGROUND

The disclosure relates to a radiation image detector with capability of automatic exposure detection (AED) and an AED method thereof.

Similar to a visible light image sensing panel, a radiation image detector utilizes a pixel array to sense an image light. Since the image light to be sensed by the radiation image detector is an X-ray, different sensing materials and mechanisms are adopted.

The image sensing mechanism of the radiation image detector is to generate electrons and holes by emitting the X-ray into a semiconductor sensing material. Specifically, the holes corresponding to each pixel are collected and converted through a circuit, so as to obtain pixel data of an image. The holes are collected to obtain positive charges, which correspond to the grayscale values of the pixels, such that the pixel array can form a digital X-ray radiation image.

Since the sensing material used by the radiation image detector is a photoconductive material for generating positive charges and negative charges, a dark current exists and results in issues regarding the background level, which will affect the accuracy of the sensed image. Besides, in the case of an inappropriate exposure time (for example, the exposure onset and cessation time points are not consistent with the activated time of the X-ray source), the image quality will also be affected.

How to improve the image sensing quality of the radiation image detector is one of the factors that should be taken into consideration for research and development.

SUMMARY

The disclosure provides a radiation image detector with capability of automatic exposure detection for improving image sensing quality.

According to an embodiment of the disclosure, a radiation image detector with capability of automatic exposure detection is provided, which includes a high voltage circuit unit that provides an operation bias. An image sensing panel receives the operation bias and senses an incident X-ray, and generates holes and electrons, wherein the holes generate positive charges for forming an image. An automatic exposure detector is coupled to the high voltage circuit unit to transfer the operation bias and detects a variation pattern with time of a sensing signal generated by the electrons to determine an onset time point and a cessation time point for exposure. A control unit is coupled to the high voltage circuit unit, the image sensing panel, and the automatic exposure detector and configured to perform a system control, including obtaining an image signal of the image from the image sensing panel. An imaging unit is coupled to the control unit and receives the image signal of the image to process the image signal and display and store the image.

According to an embodiment of the disclosure, in the radiation image detector, the image sensing panel includes a substrate, an upper electrode layer, a photoconductive layer, a hole barrier layer, and an electron barrier layer. The substrate includes a lower electrode layer and a sensing circuit, wherein the lower electrode layer receives a ground voltage of the operation bias, and the sensing circuit includes a plurality of pixels respectively receiving and converting the holes into electrical signals to be outputted to the control unit. The upper electrode layer receives a positive voltage of the operation bias. The photoconductive layer senses the incident X-ray and generates the holes and the electrons. The hole barrier layer is disposed between the photoconductive layer and the upper electrode layer. The electron barrier layer is disposed between the photoconductive layer and the lower electrode layer.

According to an embodiment of the disclosure, in the radiation image detector, the hole barrier layer blocks the holes injected from the upper electrode layer and the electron barrier layer blocks the electrons injected from the lower electrode layer.

According to an embodiment of the disclosure, in the radiation image detector, a material of the hole barrier layer is an N-type tin oxide, a material of the photoconductive layer is a doped amorphous semiconductor, and a material of the electron barrier layer is a P-type tin oxide.

According to an embodiment of the disclosure, in the radiation image detector, the image sensing panel includes a substrate, an upper electrode layer, a photoconductive layer, and a hole barrier layer. The substrate includes a lower electrode layer and a sensing circuit, wherein the lower electrode layer receives a ground voltage of the operation bias, and the sensing circuit includes a plurality of pixels respectively receiving and converting the holes into electrical signals to be outputted to the control unit. The upper electrode layer receives a positive voltage of the operation bias. The photoconductive layer senses the incident X-ray and generates the holes and the electrons. The hole barrier layer is disposed between the photoconductive layer and the upper electrode layer.

According to an embodiment of the disclosure, in the radiation image detector, the hole barrier layer blocks the holes injected from the upper electrode layer.

According to an embodiment of the disclosure, in the radiation image detector, a material of the hole barrier layer is an N-type tin oxide and a material of the photoconductive layer is a doped amorphous semiconductor.

According to an embodiment of the disclosure, in the radiation image detector, the image sensing panel includes a substrate, an upper electrode layer, a photoconductive layer, and an electron barrier layer. The substrate includes a lower electrode layer and a sensing circuit, wherein the lower electrode layer receives a ground voltage of the operation bias, and the sensing circuit includes a plurality of pixels respectively receiving and converting the holes into electrical signals to be outputted to the control unit. The upper electrode layer receives a positive voltage of the operation bias. The photoconductive layer senses the incident X-ray and generates the holes and the electrons. The electron barrier layer is disposed between the photoconductive layer and the lower electrode layer.

According to an embodiment of the disclosure, in the radiation image detector, the electron barrier layer blocks the electrons injected from the lower electrode layer.

According to an embodiment of the disclosure, in the radiation image detector, a material of the photoconductive layer is a doped amorphous semiconductor and a material of the electron barrier layer is a P-type tin oxide.

According to an embodiment of the disclosure, in the radiation image detector, the automatic exposure detector includes a current sensor and a control circuit. The current sensor receives a high voltage that is inputted to transmit an operating voltage and outputs the sensing signal. The control circuit receives the sensing signal and internally generates a reference signal dynamically varying with time. The reference signal includes a start stage and an end stage, and a time point when the sensing signal is smaller than or greater than the reference signal is detected with time, and the onset time point and the cessation time point for exposure are determined according to the start stage or the end stage.

According to an embodiment of the disclosure, in the radiation image detector, the reference signal starts with a first initial value smaller than the sensing signal in the start stage and the reference signal is adjusted dynamically to be gradually close to the sensing signal according to a change varying with time of a first difference between the reference signal and the sensing signal.

According to an embodiment of the disclosure, in the radiation image detector, the onset time point is generated when the first difference has a negative increment greater than a predetermined value in a predetermined observation time.

According to an embodiment of the disclosure, in the radiation image detector, the onset time point is determined when a falling rate of the sensing signal is greater than a predetermined falling rate.

According to an embodiment of the disclosure, in the radiation image detector, the reference signal starts with a second initial value greater than the sensing signal in the end stage and the reference signal is adjusted dynamically to be gradually close to the sensing signal according to a change varying with time of a second difference between the reference signal and the sensing signal.

According to an embodiment of the disclosure, in the radiation image detector, the cessation time point is generated when the second difference has a negative increment greater than a predetermined value in a predetermined observation time.

According to an embodiment of the disclosure, in the radiation image detector, the cessation time point is determined when a rising rate of the sensing signal is greater than a predetermined rising rate.

According to an embodiment of the disclosure, in the radiation image detector, the automatic exposure detector also communicates with the control unit, and when the control unit tracks the sensing signal and detects that when a safe region is exceeded, the control unit sends a stop signal to an X-ray source to end exposure.

According to an embodiment of the disclosure, an automatic exposure detection method adapted for a radiation image detector is provided. The radiation image detector includes: an image sensing panel receiving an operation bias and sensing an incident X-ray to generate holes and electrons, wherein the holes generate positive charges to form an image; and an automatic exposure detector determining an onset time point and a cessation time point for exposure according to the automatic exposure detection method. The automatic exposure detection method includes receiving a high voltage that is inputted to transmit the high voltage to the image sensing panel, and outputting a sensing signal by a current sensor. The method also includes receiving the sensing signal and internally generating a reference signal dynamically varying with time by a control circuit, wherein the reference signal includes a start stage and an end stage. A time point when the sensing signal is smaller than or greater than the reference signal is detected with time, and the onset time point and the cessation time point for exposure are determined according to the start stage or the end stage.

According to an embodiment of the disclosure, in the automatic exposure detection method, the reference signal starts with a first initial value smaller than the sensing signal in the start stage and the reference signal is adjusted dynamically to be gradually close to the sensing signal according to a change varying with time of a first difference between the reference signal and the sensing signal.

According to an embodiment of the disclosure, in the automatic exposure detection method, the onset time point is generated when the first difference has a negative increment greater than a predetermined value in a predetermined observation time.

According to an embodiment of the disclosure, in the automatic exposure detection method, the onset time point is determined when a falling rate of the sensing signal is greater than a predetermined falling rate.

According to an embodiment of the disclosure, in the automatic exposure detection method, the reference signal starts with a second initial value greater than the sensing signal in the end stage and the reference signal is adjusted dynamically to be gradually close to the sensing signal according to a change varying with time of a second difference between the reference signal and the sensing signal.

According to an embodiment of the disclosure, in the automatic exposure detection method, the cessation time point is generated when the second difference has a negative increment greater than a predetermined value in a predetermined observation time.

According to an embodiment of the disclosure, in the automatic exposure detection method, the cessation time point is determined when a rising rate of the sensing signal is greater than a predetermined rising rate.

According to an embodiment of the disclosure, in the automatic exposure detection method, the automatic exposure detector also communicates with the control unit, and when the control unit tracks the sensing signal and detects that when a safe region is exceeded, the control unit sends a stop signal to an X-ray source to end exposure.

According to an embodiment of the disclosure, in the automatic exposure detection method, in an update cycle of the start stage, a process of dynamically generating the reference signal includes: calculating a plurality of parameters, including reading and digitizing the sensing signal at a sampling time point; calculating a mean ($\mu$) and a standard deviation ($\sigma$) of the sensing signal at an estimated number of the sampling points by a statistical method, wherein a background level ($Q_B$) is updated according to the mean ($\mu$) and a falling rate ($R_F$) of the reference signal is calculated; determining if the falling rate ($R_F$) meets a reference signal compensation condition, namely, the falling rate ($R_F$) is smaller than or equal to a reference falling rate ($R_{FS}$) ($R_F \leq R_{FS}$), before the onset time point for exposure is reached, and exiting the process if a result is "NO", and continuing with a reference signal compensation process below if the result is "YES"; calculating a current difference D, wherein $D=(\mu-\sigma)-D_{REF}$, and the $D_{REF}$ is a current reference value; examining a condition of $D \geq Z_{SAFE}$, wherein the $Z_{SAFE}$ is a safe guard region; if the condition of $D \geq Z_{SAFE}$ is "YES", updating the $D_{REF}$ based on the $Z_{SAFE}$; if the condition of $D \geq Z_{SAFE}$ is "NO", updating the $D_{REF}$ based on the ($\mu-\sigma$); obtaining the $D_{REF}$ that has been updated; and updating the reference signal $V_{REF}$ according to the $D_{REF}$.

According to an embodiment of the disclosure, in the automatic exposure detection method, in an update cycle after the start stage, a process of dynamically generating the reference signal includes: calculating a plurality of parameters, including reading and digitizing the sensing signal at a sampling time point; calculating a mean ($\mu$) and a standard deviation ($\sigma$) of the sensing signal at a plurality of the sampling points by a statistical method, calculating a reference value ($\mu+\sigma$), and updating a background level ($Q_B$) according to the mean ($\mu$); accumulating ($\mu-Q_B$) to obtain a total charge amount $Q_T$; examining $Q_S \leq Q_T$, wherein the X-ray is stopped if $Q_S \leq Q_T$, or a following process is performed; calculating a rising rate ($R_S$) of the sensing signal; determining if the rising rate ($R_S$) meets a reference signal compensation condition, namely, the rising rate ($R_S$) is smaller than or equal to a reference falling rate ($R_{FS}$) ($R_S \leq R_{RS}$), before the cessation time point for exposure is reached, and exiting the process if a result is "NO", and continuing with a reference signal compensation process below if the result is "YES"; calculating a current difference D, wherein $D=D_{REF}-(\mu+\sigma)$, and the $D_{REF}$ is a current reference value; examining a condition of $D \geq Z_{SAFE}$, wherein the $Z_{SAFE}$ is a safe guard region; if the condition of $D \geq Z_{SAFE}$ is "YES", updating the $D_{REF}$ based on the $Z_{SAFE}$; if the condition of $D \geq Z_{SAFE}$ is "NO", updating the $D_{REF}$ based on the ($\mu+\sigma$); obtaining the $D_{REF}$ that has been updated; and updating the reference signal $V_{REF}$ according to the $D_{REF}$.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure relates to a radiation image detector with capability of automatic exposure detection, which is capable of efficiently sensing an X-ray image light, so as to improve the radiation image quality.

Some embodiments are provided below as examples of the disclosure. Nevertheless, the disclosure is not limited to any of these embodiments.

Figure 1:
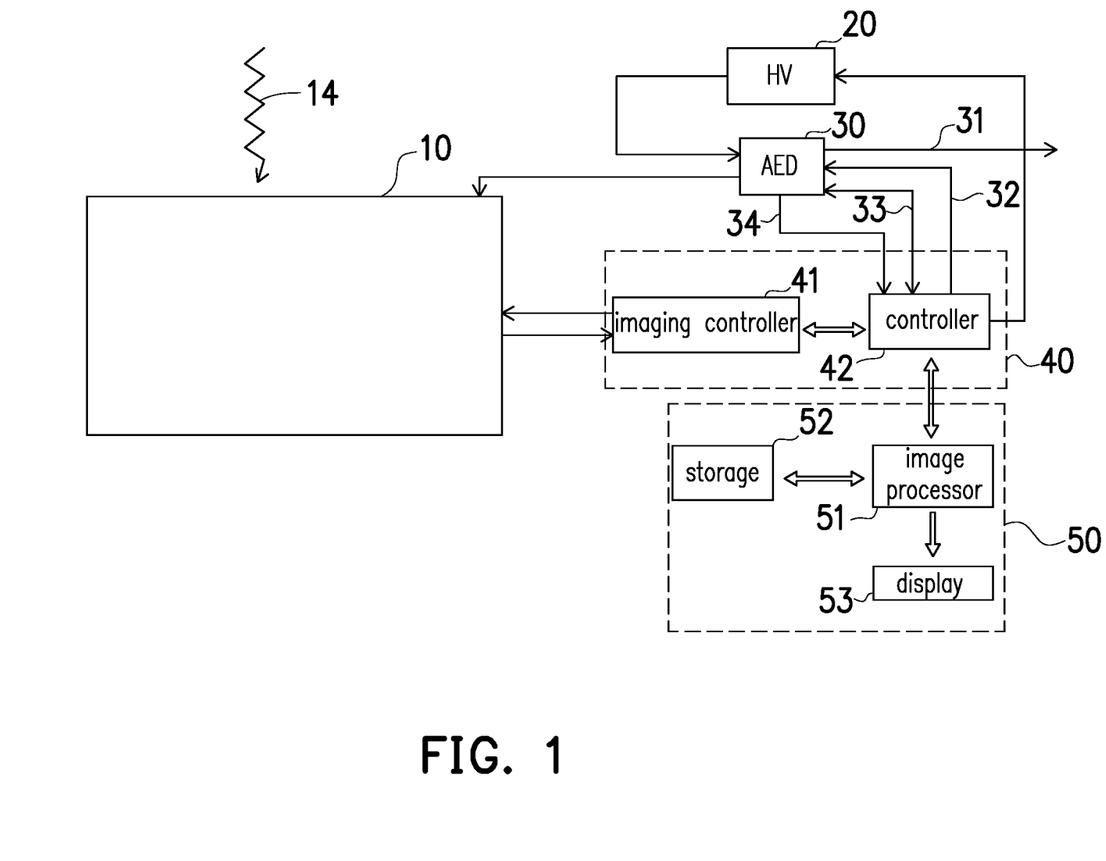
FIG. 1 is a schematic diagram showing a circuit architecture of the radiation image detector according to an embodiment of the disclosure.

FIG. 1 is a schematic diagram showing a circuit architecture of the radiation image detector according to an embodiment of the disclosure. Referring to FIG. 1, in terms of the overall architecture of the radiation image detector, the radiation image detector provided according to an embodiment of the disclosure has capability of automatic exposure detection and includes an image sensing panel 10, a high voltage (HV) circuit unit 20 represented by HV, an automatic exposure detector (AED) 30 represented by AED, a control unit 40, and an imaging unit 50. The structure and function of each circuit block are described in detail hereinafter.

In terms of the overall operation, the high voltage circuit unit 20 provides an operation bias. The operation bias is generally a high voltage of 1000V, for example. The image sensing panel 10 receives the operation bias provided by the high voltage circuit unit 20 via the automatic exposure detector (AED) 30 and senses an incident X-ray 14 to generate holes and electrons. A mechanism thereof will be described in detail later. The holes generate positive charges for forming an image. The automatic exposure detector (AED) 30 is coupled to the high voltage circuit unit (HV) 20 to transfer the operation bias and detect a sensing signal generated by the electrons of the image sensing panel 10, and a variation pattern with time thereof determines an onset time point and a cessation time point of exposure. The control unit 40 is coupled to the high voltage circuit unit (HV) 20, the image sensing panel 10, and the automatic exposure detector (AED) 30 and is configured to perform a system control, which includes obtaining an image signal of the image from the image sensing panel 10. The imaging unit 50 is coupled to the control unit 40 and receives the image signal of the image to process the image signal and display and store the image. The control unit 40 includes an imaging controller 41 and a system controller 42, for example. The imaging controller 41 controls on/off of pixels of the image sensing panel 10 and imaging of the corresponding pixels. The system controller 42 performs control over the entire system. The imaging unit 50 includes an image processor 51 for processing the image signal, for example, which is to be displayed by a display 53 then. A storage 52 may store the image.

Figure 2:
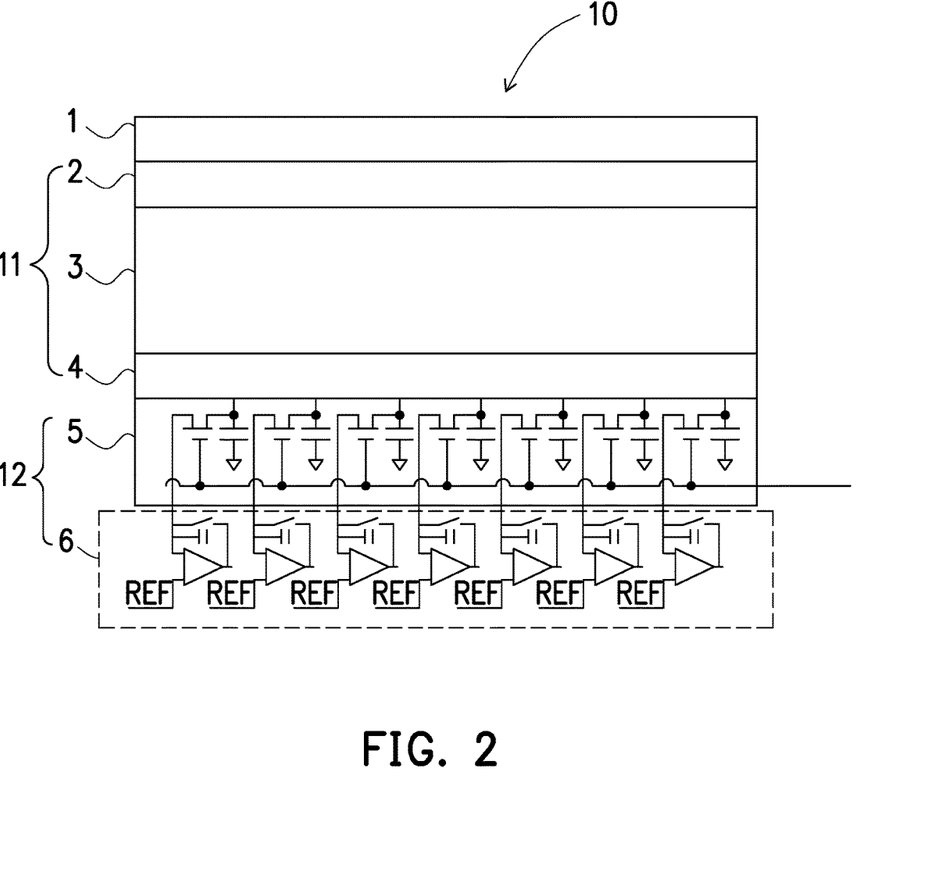
FIG. 2 is a schematic diagram showing the image sensing panel according to an embodiment of the disclosure.

FIG. 2 is a schematic diagram showing the image sensing panel according to an embodiment of the disclosure. Referring to FIG. 2, the image sensing panel 10 includes an upper electrode layer 1, a hole barrier layer 2, a photoconductive layer 3, an electron barrier layer 4, and a substrate 12. The hole barrier layer 2, the photoconductive layer 3, and the electron barrier layer 4 constitute a semiconductor laminate layer 11. The substrate 12 includes a lower electrode layer 5 and a sensing circuit 6. The lower electrode layer 5 receives a ground voltage of the operation bias. According to the configuration of a pixel array, the sensing circuit includes a plurality of pixels respectively receiving and converting the holes into electrical signals to be outputted to the control unit 40. The upper electrode layer 1 receives a positive voltage of the operation bias. The photoconductive layer 3 senses the incident X-ray and generates the holes and the electrons. The hole barrier layer 2 is disposed between the photoconductive layer 3 and the upper electrode layer 1. The electron barrier layer 4 is disposed between the photoconductive layer 3 and the lower electrode layer 5.

Figure 3:
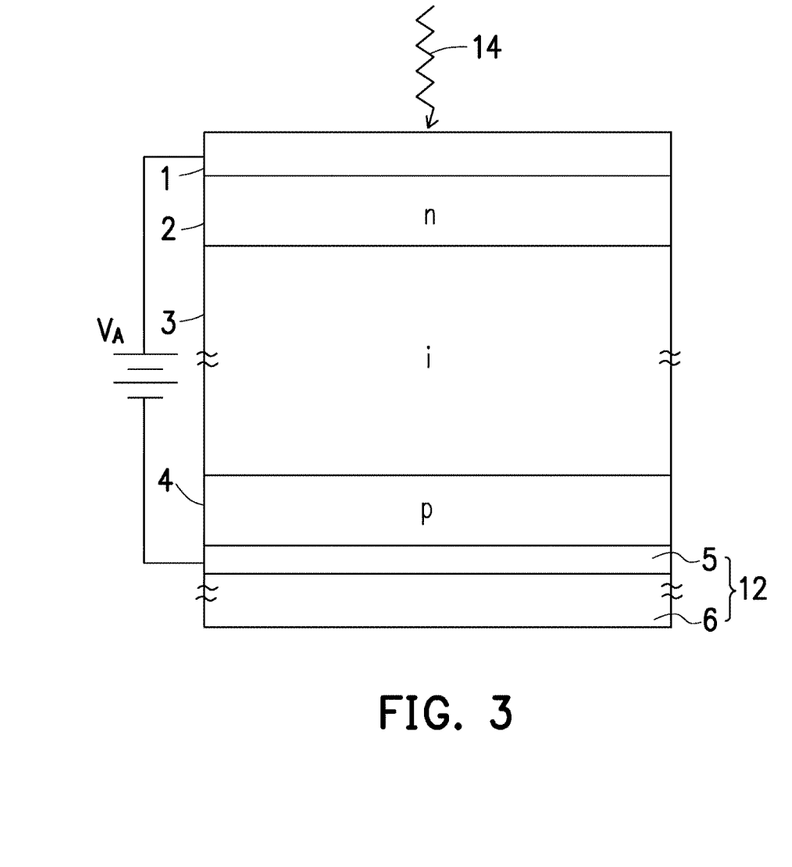
FIG. 3 is a schematic diagram showing an operation of the image sensing panel according to an embodiment of the disclosure.
Figure 4:
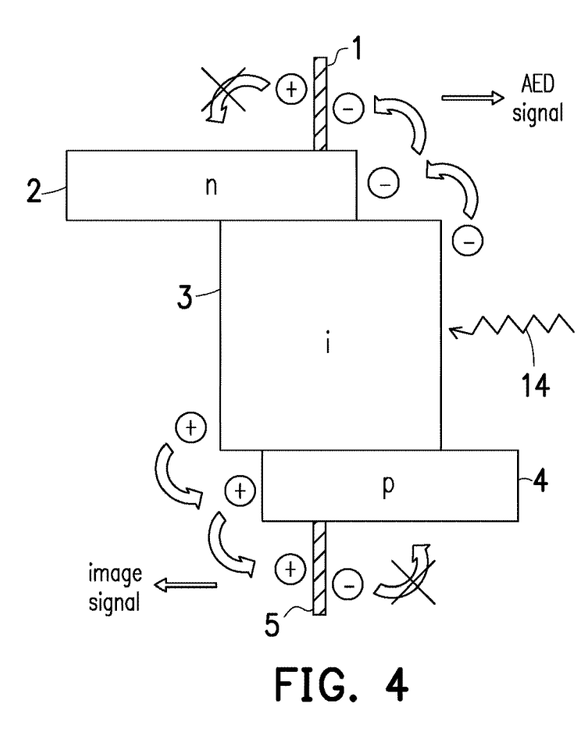
FIG. 4 is a schematic diagram showing a sensing mechanism of the image sensing panel according to an embodiment of the disclosure.

The sensing mechanism of the image sensing panel 10 is further described hereinafter. FIG. 3 is a schematic diagram showing an operation of the image sensing panel according to an embodiment of the disclosure. FIG. 4 is a schematic diagram showing the sensing mechanism of the image sensing panel according to an embodiment of the disclosure.

Referring to FIG. 3 and FIG. 4, a material of the photoconductive layer 3 is amorphous selenium (Se), for example, and may be an alloy of selenium and a small amount (0.1% to 0.8%) of arsenic (As), for example, so as to prevent crystallization. In addition, the material may be doped with chlorine (Cl) of 10 ppm to 200 ppm, for example, so as to increase transport of hole carriers. A thickness of the photoconductive layer is in a range of 100 μm to 2000 μm, for example. For mammography, for example, the thickness may be in a range of 150 μm to 250 μm. Moreover, for general images, for example, the thickness may be in a range of 500 μm to 1000 μm. In an embodiment, the hole barrier layer 2 is an N-type tin oxide ($SnO_2$ or $SnO_X$, $1<x\leq 2$), for example. Pure $SnO_2$ is a degenerate N-type oxide semiconductor with an energy gap of 3.6 eV. The hole barrier layer 2 is formed, for example, by using tin Sn as the target for sputtering in an atmosphere of argon Ar containing 15% oxygen, or by using a tin dioxide $SnO_2$ as the target for sputtering in an atmosphere of argon Ar containing 10% hydrogen, and the thickness is in a range of 10 nm to 200 nm, for example. The electron barrier layer 4 is a P-type tin oxide (SnO or $SnO_X$, $1\leq x<2$), for example. To generate P-type properties, for example, tin Sn may be used as the target in an atmosphere of argon Ar containing 8% oxygen ($[O_2]/([O_2]+[Ar])$), or tin dioxide $SnO_2$ may be used as the target in an atmosphere of argon (Ar) containing 33% hydrogen ($[H_2]/([H_2]+[Ar])$), and the thickness is in a range of 10 nm to 200 nm, for example. Nevertheless, the disclosure is not limited to the materials specified above and the above may be produced by any of the following methods, for example: electron beam evaporation, pulsed laser deposition, chemical vapor evaporation, aqueous solution process, hydrothermal synthesis, magnetron sputtering, and so on.

When the X-ray 14 enters the photoconductive layer 3, under an operating voltage and based on the material properties, the X-ray 14 has different intensities depending on the object that the X-ray 14 passes through and interacts with the photoconductive layer 3 to be converted into a relative number of electrons and holes. A positive terminal of the operating voltage ($V_A$) is connected to the upper electrode layer 1 and a negative terminal of the operating voltage ($V_A$) is connected to the lower electrode layer 5 of the substrate 12. The electrons are negatively charged and drift toward the upper electrode layer 1 and the holes are positively charged and drift toward the lower electrode layer 5. FIG. 4 shows the drift mechanism of the electrons and the holes and is also an energy band diagram of the material of each layer.

In an embodiment of the disclosure, based on the photoconductive layer 3, the hole barrier layer 2 is disposed between the photoconductive layer 3 and the upper electrode layer 1. The electron barrier layer 4 is disposed between the photoconductive layer 3 and the lower electrode layer 5. The hole barrier layer 2 blocks or traps the holes injected from the upper electrode layer 1. The electron barrier layer 4 blocks the electrons injected from the lower electrode layer 5.

In order to block the holes injected from the upper electrode layer 1, the hole barrier layer 2 is an N-type material, such as an N-type tin oxide ($SnO_2$ or $SnO_X$), for example, which is capable of blocking or trapping the positive holes. In order to block the electrons injected from the lower electrode layer 5, the electron barrier layer 5 is a P-type material, such as a P-type tin oxide (SnO or $SnO_X$), for example, which is capable of blocking or trapping the negative electrons. Thus, because of the functions of the hole barrier layer 2 and the electron barrier layer 4, the image sensing panel 10 is less likely to be affected by an external power supply. And the holes generated by the photoconductive layer 3 are more accurately collected to serve as the image signal. Meanwhile, the electrons generated by the photoconductive layer 3 are more accurately collected to serve as the AED signal of the automatic exposure detector (AED) 30. As such, the onset time point and the cessation time point of exposure may be determined automatically according to a feature pattern of the AED signal relative to generation and end of the X-ray. The feature pattern and the determining method will be described in detail later.

Figure 9:
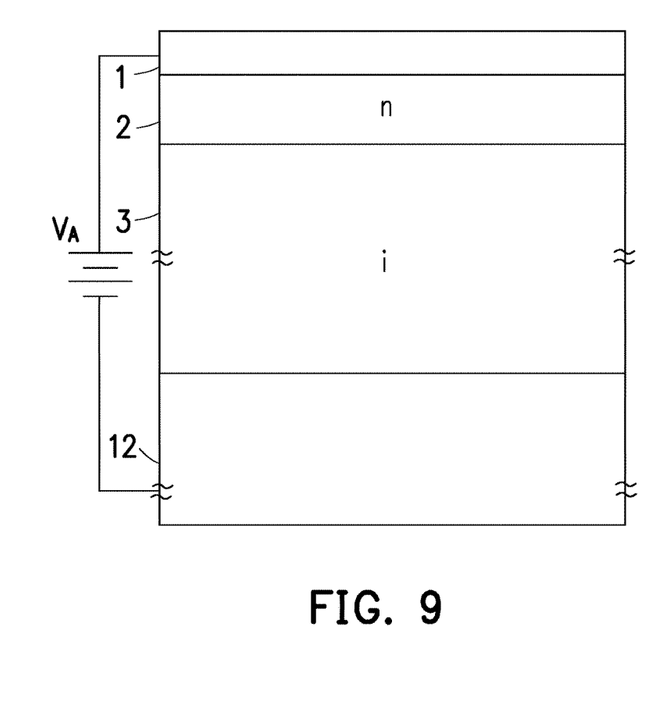
FIG. 9 is a schematic diagram showing the image sensing panel according to an embodiment of the disclosure.
Figure 10:
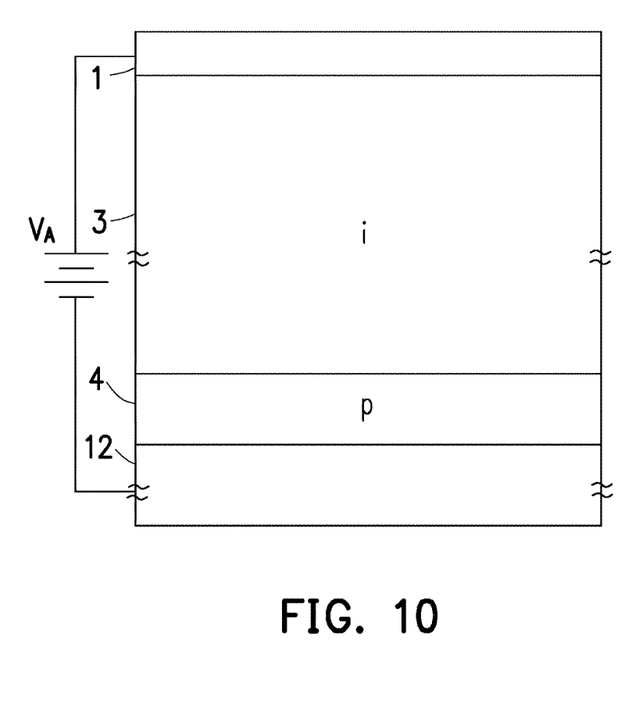
FIG. 10 is a schematic diagram showing the image sensing panel according to an embodiment of the disclosure.

Here, the materials of the hole barrier layer 2 and the electron barrier layer 4 of the disclosure are not limited to the materials described above. Any material that achieves the desired N/P-type and conductive properties may be used. In addition, not both the hole barrier layer 2 and the electron barrier layer 4 are necessary. It is possible to dispose one of the hole barrier layer 2 and the electron barrier layer 4, as shown in FIG. 9 and FIG. 10 described later.

Figure 5:
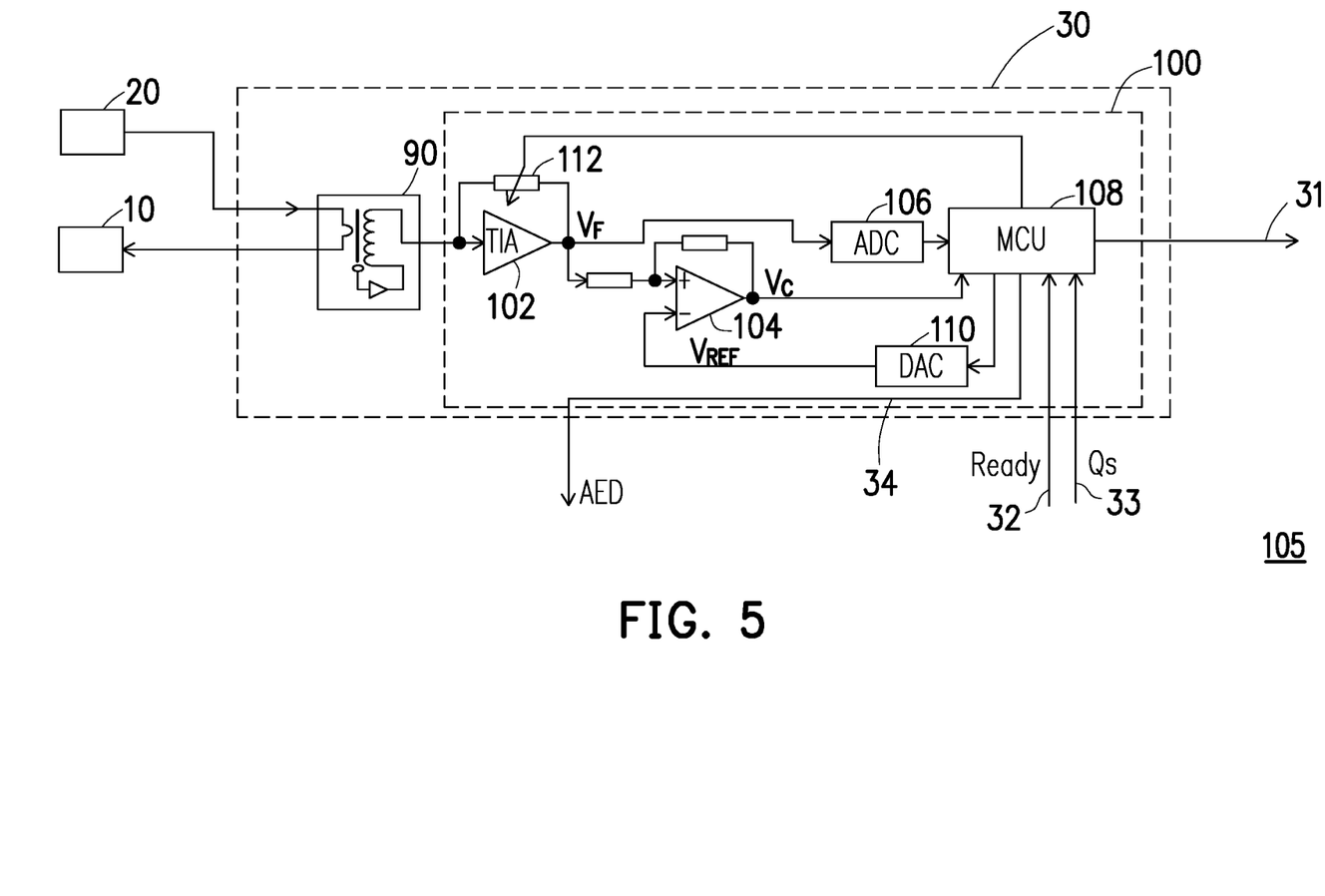
FIG. 5 is a schematic diagram showing the automatic exposure detector according to an embodiment of the disclosure.

Based on the functions of the hole barrier layer 2 and the electron barrier layer 4, the AED signal is generated to be detected by the automatic exposure detector (AED) 30. First, a circuit architecture of the automatic exposure detector (AED) 30 is described hereinafter. FIG. 5 is a schematic diagram showing the automatic exposure detector according to an embodiment of the disclosure. Referring to FIG. 5, the automatic exposure detector (AED) 30 includes a current sensor 90 and a control circuit 100. The current sensor 90 receives the high voltage inputted by the high voltage circuit unit (HV) 20. Through the current sensor 90, the operating voltage is provided to the upper electrode layer 1 of the image sensing panel 10. The current sensor 90 senses the upper electrode layer 1 and outputs a sensing signal. The sensing signal includes an electron effect generated in the photoconductive layer 3.

Figure 6:
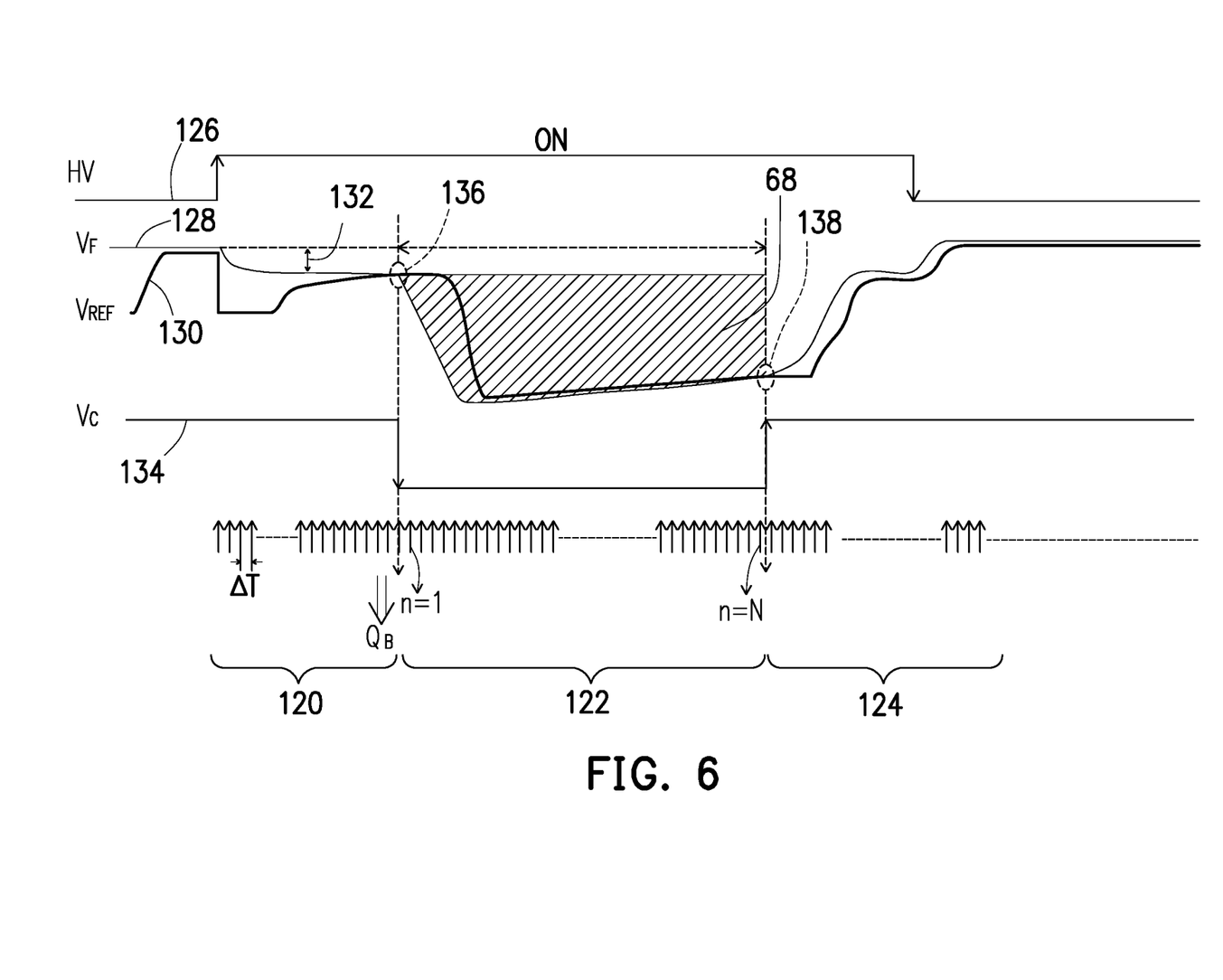
FIG. 6 is a schematic diagram showing the signal feature pattern and the sensing mechanism of the automatic exposure detector according to an embodiment of the disclosure.

FIG. 6 is a schematic diagram showing the signal feature pattern and the sensing mechanism of the automatic exposure detector according to an embodiment of the disclosure. Please also refer to FIG. 6 for the overall operation. In a period when the voltage signal 126 provided by the control circuit 100 to turn on the high voltage circuit unit (HV) 20, the control circuit 100 receives the sensing signal $V_F$ 128 and internally generates the reference signal $V_{REF}$ 130 dynamically varying with time. And at the instant when the high voltage circuit unit (HV) 20 is ON, the reference signal $V_{REF}$ 130 drops. The reference signal $V_{REF}$ 130 includes a start stage 120 and an end stage 124. An exposure stage 122 exists between the start stage 120 and the end stage 124. As the detection proceeds with time, at the time point when the sensing signal $V_F$ 128 is smaller than or greater than the reference signal $V_{REF}$ 130, as the area marked, the onset time point 136 and the cessation time point 138 of the exposure stage 122 are determined according to the start stage 120 or the end stage 124. In the area of the start stage 120, the reference signal $V_{REF}$ 130 is smaller than the sensing signal $V_F$ 128 ($V_{REF}$<$V_F$); and in the area of the end stage 124, the reference signal $V_{REF}$ 130 is smaller than the sensing signal $V_F$ 128 ($V_{REF}$<$V_F$). At the end of the area of the start stage 120, irradiation of the X-ray causes the sensing signal $V_F$ 128 to drop and causes the sensing signal $V_F$ 128 to become smaller than the reference signal $V_{REF}$ 130 ($V_F$<$V_{REF}$), such that the output signal Vc 134 of a differential comparator 104 transits (High to Low) and triggers a microcontroller 108 to determine the onset time point 136 for exposure. Then, in the exposure stage 122, the reference signal $V_{REF}$ 130 is greater than the sensing signal $V_F$ 128 ($V_{REF}$>$V_F$), and the reference signal $V_{REF}$ 130 is continuously compensated to be closer to the sensing signal $V_F$ 128 and is maintained slightly greater than the sensing signal $V_F$ 128. At the end of the exposure stage 122, the X-ray is turned off to cause the sensing signal $V_F$ 128 to rise slowly and cause the sensing signal $V_F$ 128 to be greater than the reference signal $V_{REF}$ 130 ($V_F$>$V_{REF}$), such that the output signal Vc of the differential comparator 104 transits in the other manner (Low_to_High) and triggers the microcontroller 108 to determine the cessation time point 138 of exposure. The comparison between the values of the reference signal $V_{REF}$ 130 and the sensing signal $V_F$ 128 and the values of the two transitions of the output signal Vc of the differential comparator 104 determine the section of the exposure stage 122.

Reverting to FIG. 5, regarding the circuit architecture, the current sensor 90 outputs a current sensing signal, and through conversion of a transimpedance amplifier (TIA) 102, the current sensing signal is converted by the transimpedance amplifier 102 into a voltage sensing signal, so as to obtain the sensing signal $V_F$. The sensing signal $V_F$ is sampled by an analog-to-digital converter (ADC) 106 and the state thereof is determined by the microcontroller unit (MCU) 108, so as to determine the onset time point and the cessation time point for exposure.

Since the reference signal $V_{REF}$ is dynamically adjusted varying with time by reference to the state of the sensing signal $V_F$ in the disclosure, the microcontroller unit (MCU) 108 converts the adjusted reference signal $V_{REF}$ into an analog reference signal $V_{REF}$ through a digital-to-analog converter (DAC) 110. Further, the analog reference signal $V_{REF}$ compares with the sensing signal $V_F$ through the comparator 104, so as to obtain the difference signal Vc. The difference signal Vc is analyzed in the microcontroller unit (MCU) 108 to output an automatic exposure detection (AED) signal 34. The determining mechanism of the microcontroller unit (MCU) 108 will be described later. For other considerations in favor of safety, a ready signal 32 and an exposure index ($Q_S$) 33 are also inputted to the microcontroller unit (MCU) 108 as reference. When the operation state does not meet the requirement of the exposure index ($Q_S$) 33, a disable signal 31 may be forcibly issued to stop the operation. The microcontroller unit (MCU) 108 also controls a variable resistor 112 of the transimpedance amplifier 102 to adjust a gain thereof.

Referring to FIG. 6, the reference signal $V_{REF}$ 130 and the sensing signal $V_F$ 128 are voltage signals. When the voltage signal (HV) 126 changes to the ON state and the operating voltage is provided, the image sensing panel 10 has not received the X-ray yet nor started the exposure, and therefore is in the start stage 120. In the start stage 120, since the high voltage causes the image sensing panel 10 to generate a dark current, and the sensing signal $V_F$ 128 starts to drop slowly. At this time, a background level 132 of the sensing signal $V_F$ 128 mainly comes from the dark current and other possible noise. Meanwhile, the automatic exposure detector (AED) 30 instructs the control unit 40, such that the lower electrode layer 5 and the sensing circuit 6 start to continuously clear the dark current on the image sensing panel 10 to tend toward a relatively stable state. When the X-ray enters the image sensing panel 10, the sensing signal $V_F$ 128 leaves the voltage value of the background level 132 and drops significantly instantly. The "instantly" may be an immediate change and may also be understood as a stepped change in a short time. In FIG. 6, the upward arrows at the bottom indicate the time points for sampling. That is, the sensing signal $V_F$ 128 and the reference signal $V_{REF}$ 130 are sampled according to the time intervals. Here, in order to prevent a sampling deviation at each sampling point, in an embodiment, the sensing signal $V_F$ 128 and the reference signal $V_{REF}$ 130 are means of multiple sampling points obtained by a statistical method.

Regarding the setting of the reference signal $V_{REF}$ 130 in the disclosure, when the voltage signal 126 is still OFF, the reference signal $V_{REF}$ 130 is first set to a range away from the sensing signal $V_F$ 128. And then through analysis of the microcontroller unit (MCU) 108 of the control circuit 100, the reference signal $V_{REF}$ 130 is gradually adjusted to be close to the sensing signal $V_F$ 128. At this time, according to the falling rate or amplitude, the reference signal $V_{REF}$ 130 and the sensing signal $V_F$ 128 are approximately close to each other, but the reference signal $V_{REF}$ 130 is maintained slightly smaller than the sensing signal $V_F$ 128.

When the X-ray actually enters the image sensing panel 10, since the photoconductive layer 3 senses the X-ray and generates a large number of electron-hole pairs, the current suddenly increases and is converted into the sensing signal $V_F$ 128 in the voltage signal form, which results in a drop. The differential comparator 104 of the automatic exposure detector (AED) 30 transits instantly. A falling edge of the output signal Vc 134 of the differential comparator 104 triggers the microcontroller unit (MCU) 108 to enter the exposure stage 122. And at the same time, the automatic exposure detector (AED) 30 instructs the control unit 40 to stop clearing the dark current on the image sensing panel 10. The falling rate of the sensing signal $V_F$ 128 increases in a short time, or the amplitude of the sensing signal $V_F$ 128 becomes apparently smaller than the reference signal $V_{REF}$ 130 in a short time. Therefore, the exposure onset time point 136 may be determined according to the time point detected. Here, the exposure onset time point 136 may be the same as the time point detected or slightly delayed within a reasonable range. On the other hand, at the time point when the sensing signal $V_F$ 128 is smaller than the reference signal $V_{REF}$ 130 ($V_F$<$V_{REF}$), the output signal Vc 134 of the differential comparator 104 transits (High_to Low) and triggers the microcontroller 108 for determining the exposure onset time point 136.

According to an embodiment of the actual operation, the reference signal $V_{REF}$ 130 starts with an initial value smaller than the sensing signal $V_F$ 128 in the start stage 120. And the reference signal $V_{REF}$ 130 is adjusted dynamically to be gradually close to the sensing signal $V_F$ 128 according to a difference (first difference) that changes, varying with time between the reference signal $V_{REF}$ 130 and the sensing signal $V_F$ 128.

In the start stage 120, the reference signal $V_{REF}$ 130 is smaller than the sensing signal $V_F$ 128. Therefore, the difference is a negative value in the start stage 120. However, the difference changes from a negative value to a positive value when entering the exposure stage 122. Since the sign of the difference indicates the opposite, it may also be called a negative increment. Because the sensing signal $V_F$ 128 drops when the X-ray enters, in an embodiment, it is determined whether the negative increment is greater than a predetermined amount. In an embodiment, in order to increase the accuracy of the determination, in addition to instant determination, observation may be performed for a predetermined observation time (including instant) for determination, so as to generate the onset time point 136. Moreover, since the sensing signal $V_F$ 128 drops, when the sensing signal $V_F$ 128 is observed based on the falling rate, it also drops significantly in a short time. Then, the onset time point 136 is determined through comparison, for example, whether the falling rate is greater than a predetermined falling rate.

The same mechanism may also be used for determining the cessation time point 138 of the exposure stage 122. Considering the negative increment (changing from a positive value to a negative value) of the difference (second difference) between the reference signal $V_{REF}$ 130 and the sensing signal $V_F$ 128, the cessation time point 138 is determined. Or considering the rising rate, the cessation time point 138 is determined by observing the time point when the rising sensing signal becomes greater than a predetermined rising rate.

After passing the exposure onset time point 136, according to the similar principle for the start stage 120 as described above, the reference signal $V_{REF}$ 130 is also adjusted to be close to the sensing signal $V_F$ 128 but is maintained greater than the sensing signal $V_F$ 128. When the X-ray ends or is turned off, the sensing current generated by the electron-hole pairs disappears. The voltage of the sensing signal $V_F$ 128 rises apparently to return to the state of dark current. When the rising sensing signal $V_F$ 128 becomes greater than the reference signal $V_{REF}$ 130, the output signal Vc 134 of the differential comparator 104 has a Low_to_High transition and reaches a high level. And the rising edge of the output signal Vc 134 is used for triggering the microcontroller 108 to stop the exposure stage 122 and enter the end stage 124. However, in terms of actual application, the detected time point may be used to determine the exposure cessation time point 138, which may be instant or be reasonably delayed for a short period of time.

Figure 7:
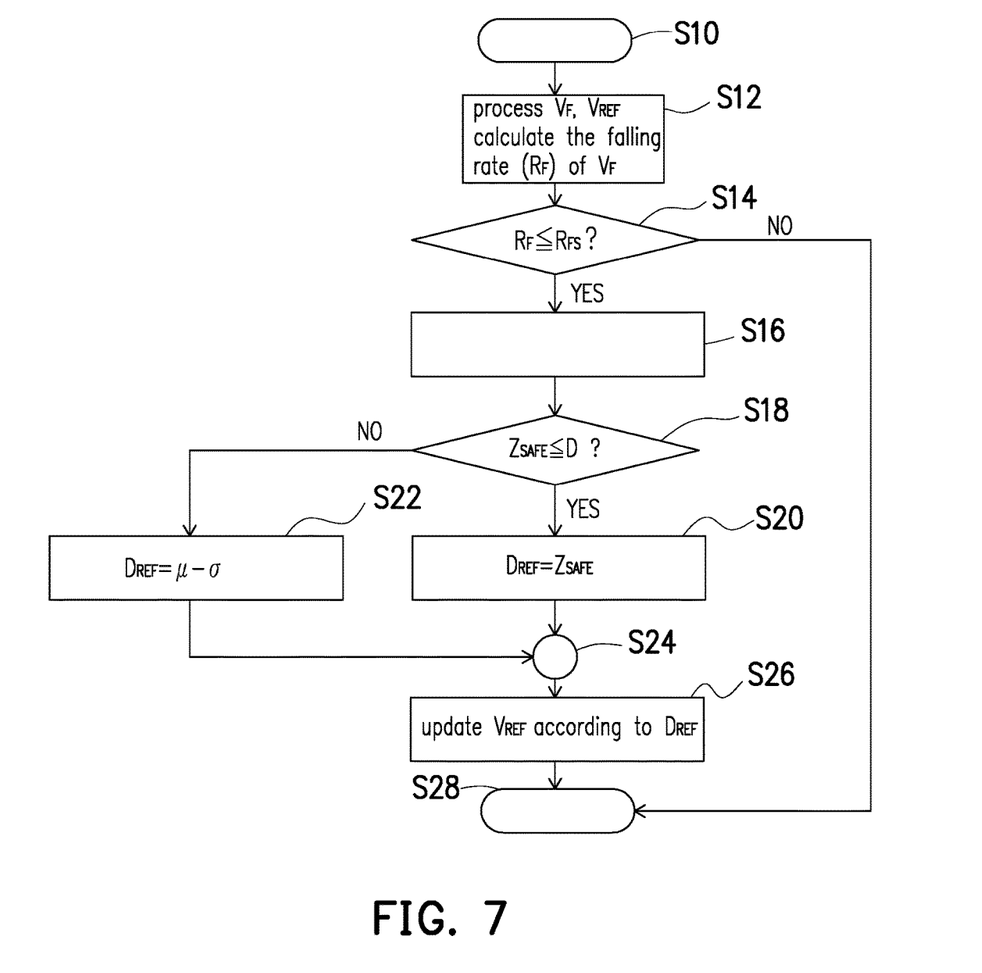
FIG. 7 is a schematic diagram showing the mechanism of dynamically updating the reference voltage for onset time point detection in an automatic exposure detection method according to an embodiment of the disclosure.

The mechanism described above may be completed by the control circuit 100, wherein the microcontroller unit (MCU) 108 may execute a program required to perform the calculation and comparison. FIG. 7 is a schematic diagram showing the mechanism of dynamically updating the reference voltage for onset time point detection in an automatic exposure detection method according to an embodiment of the disclosure. Referring to FIG. 7, according to the mechanism of FIG. 6, the reference signal $V_{REF}$ is updated dynamically. The reference signal $V_{REF}$ is first set smaller than the background level ($Q_B$) and then gradually rises with time to be close to the sensing signal $V_F(\mu)$. Thereafter, the reference signal $V_{REF}$ is updated according to the updating method described hereinafter. In terms of control, in Step S10, an update cycle starts when a time start signal is sent. Step S12 relates to calculation of some parameters, including reading and digitizing the sensing signal $V_F$ at the sampling time point. For the sensing signal $V_F$ at multiple sampling points, the mean ($\mu$) and the standard deviation ($\sigma$) are calculated by a statistical method. The background level ($Q_B$) is updated according to the mean ($\mu$), such that the background level is equal to the mean ($Q_B=\mu$). The mean ($\mu$) refers to the statistical mean of the signal voltages. The falling rate ($R_F$) of the mean $V_F(\mu)$ is calculated, wherein $V_F(\mu)$ represents the $V_F$ value of the sensing signal $V_F$ at the sampling points obtained through statistical mean calculation. Step S14 is to determine that the exposure onset time point has not been reached yet. That is, if the falling rate ($R_F$) of the sensing signal remains smaller than or equal to the reference falling rate ($R_{FS}$), ($R_F \leq R_{FS}$) is met, and the update of the reference signal continues; otherwise, the process proceeds to Step S28 and ends the update directly.

In Step S16, a current difference D is calculated, wherein $D=(\mu-\sigma)-D_{REF}$. $D_{REF}$ is a current reference value, which is a given value initially but is updated with time in the subsequent Step S20 or S22. In Step S18, the condition of $D \geq Z_{SAFE}$ is checked, wherein $Z_{SAFE}$ is a safe guard region of a reasonably estimated adjustment range. That is, if the current difference D is overly large, however, it can only be adjusted to the value of $Z_{SAFE}$ at maximum. In other words, if the result of Step S18 is "YES", $D_{REF}$ is updated based on $Z_{SAFE}$ in Step S20. That is, $D_{REF}$ is equal to $Z_{SAFE}$. If the result of Step S18 is "NO", $D_{REF}$ is updated based on ($\mu-\sigma$). That is, $D_{REF}$ is equal to ($\mu-\sigma$). In Step S24, the updated $D_{REF}$ is obtained. In Step S26, the reference signal $V_{REF}$ is updated according to $D_{REF}$. In Step S28, this update cycle ends.

Here, if the falling rate ($R_F$) of the sensing signal $V_F$ increases in the process, the difference signal $V_C$ transits (from the high level HIGH to the low level LOW) and the microcontroller unit (MCU) 108 is triggered, and it may be expected that the X-ray is already on, that is, the X-ray onset time point is detected. The microcontroller unit (MCU) 108 outputs the automatic exposure detection (AED) signal 34 at the high level HIGH to notify the imaging controller 41 and the system controller 42 of entry of the exposure period. Since the exposure has started, the cessation time point needs to be detected next. In the exposure stage 122, the reference signal ($V_{REF}$) remains horizontal at first. Later, the reference signal ($V_{REF}$) drops and maintains slightly greater than the sensing signal $V_F$. The reference signal ($V_{REF}$) then gradually rises until the cessation time point reaches.

Figure 8:
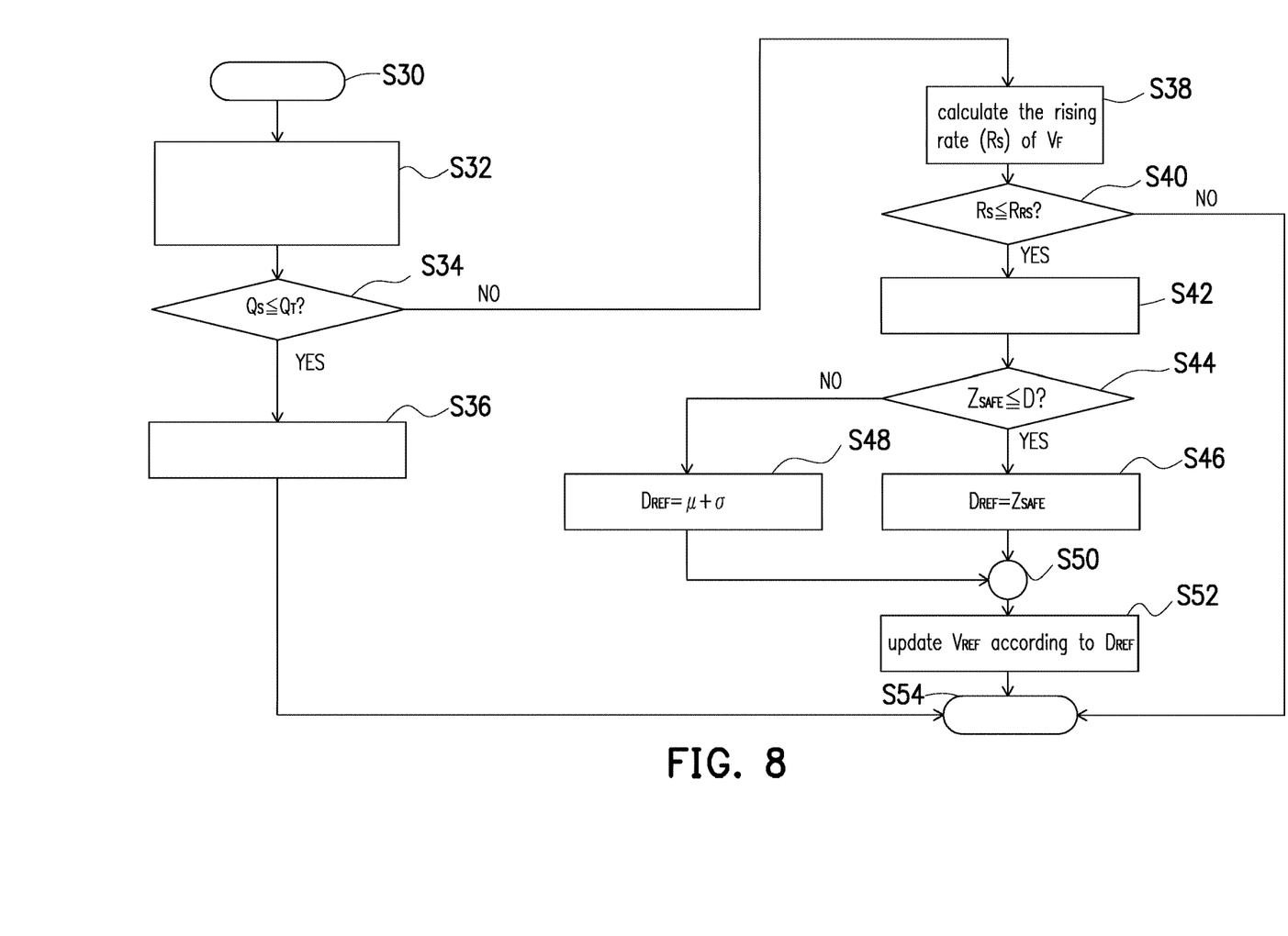
FIG. 8 is a schematic diagram showing the mechanism of dynamically updating the reference voltage for cessation time point detection in the automatic exposure detection method according to an embodiment of the disclosure.

FIG. 8 is a schematic diagram showing the mechanism of dynamically updating the reference voltage for cessation time point detection in the automatic exposure detection method according to an embodiment of the disclosure.

Referring to FIG. 8, in Step S30, an update cycle for cessation time point detection starts after a time start signal is sent. Step S32 relates to calculation of some parameters, including reading and digitizing the sensing signal $V_F$ at the sampling time point. For the sensing signal $V_F$ at multiple sampling points, the mean ($\mu$) and the standard deviation ($\sigma$) are calculated by a statistical method. A reference value ($\mu+\sigma$) is calculated as well. The background level ($Q_B$) is updated according to the mean (A such that the background level is equal to the mean ($Q_B=\mu$). A total charge amount $Q_T$ is obtained by accumulating ($\mu-Q_B$), and the equation is $Q_T(n)=Q_T(n-1)+(\mu(n)-Q_B)$. When entering the exposure stage 122, the total charge amount $Q_T$ is reset to 0 and then starts to accumulate for gradually adjusting the reference voltage $V_{REF}$, which is calculated as shown by the equation (1):

$$Q_T(N) = \sum_{n=1}^{N}(Q_B - \mu(n)), \quad (1)$$

$Q_T(N)$ represents the total charge amount $Q_T$ at the $N^{th}$ sampling time point after start of the exposure stage;

N represents the number of the sampling points;
n represents the $n^{th}$ sampling point;
μ(n) represents the $n^{th}$ mean of the signal voltages from the preceding sampling points; and
$Q_B$ represents the background value of the signal voltage, which is the signal voltage mean that is obtained by the last sampling in the start stage 120.

The accumulated total charge amount $Q_T(N)$ obtained along with the N sampling time points in the exposure stage, as indicated by the accumulated area 68 excluding the background value $Q_B$, may be compared with the exposure index $Q_S$ for identifying overexposure, so as to stop the exposure forcibly. The total charge amount $Q_T(N)$ is equal to an integration of the area swept by the horizontal line of the onset time point 136 and the sensing signal $V_F$, and the dose of the X-ray 14 may be inferred from the total charge amount $Q_T(N)$. And the exposure time of the X-ray 14 may be known from the onset time point 136 and the cessation time point 138.

In Step S34, for safety, whether the exposure index $Q_S$ is smaller than or equal to the total charge amount $Q_T$ ($Q_S \le Q_T$) is examined first. If $Q_S \le Q_T$ is met, in Step S36, the disable signal 31 is transmitted to the X-ray source to stop the X-ray; otherwise, the reference signal $V_{REF}$ starts updating for the exposure cessation time point. In Step S38, the rising rate ($R_S$) of the mean $V_F(\mu)$ is calculated. Step S40 is to determine that the exposure cessation time point has not been reached yet. That is, if the rising rate ($R_S$) of the sensing signal remains smaller than or equal to the expected rising rate ($R_{RS}$) of exposure cessation, ($R_S \le R_{RS}$) is met, and the update of the reference signal continues; otherwise, the process proceeds to Step S54 and ends the update directly.

In Step S42, the current difference D is calculated, wherein $D = D_{REF} - (\mu + \sigma)$, and $D_{REF}$ is the current reference value. In Step S44, the condition of $D \ge Z_{SAFE}$ is examined, wherein $Z_{SAFE}$ represents the safe guard region. If the result of Step S44 is "YES", $D_{REF}$ is updated based on $Z_{SAFE}$ in Step S46. That is, $D_{REF}$ is equal to $Z_{SAFE}$. If the result of Step S44 is "NO", is updated $D_{REF}$ is updated based on $(\mu + \sigma)$. That is, $D_{REF}$ is equal to $(\mu - \sigma)$. In Step S50, the updated $D_{REF}$ is obtained. In Step S52, the reference signal $V_{REF}$ is updated according to $D_{REF}$. In Step S54, this update cycle ends.

Here, if the rising rate ($R_S$) of the sensing signal $V_F$ increases in the process, the difference signal $V_C$ transits (from the low level LOW to the high level HIGH) and the microcontroller unit (MCU) 108 is triggered, and it may be expected that the X-ray is already off, that is, the X-ray cessation time point is detected. The microcontroller unit (MCU) 108 outputs the automatic exposure detection (AED) signal 34 at the low level LOW to notify the system controller 42 to end the exposure period. The imaging controller 41 reads the signal in the image sensing panel 10 to facilitate the subsequent image processing display and storage and complete the exposure operation cycle.

The image sensing panel 10 of FIG. 2 includes the hole barrier layer 2 and the electron barrier layer 4. However, a similar effect may be achieved by disposing one of the hole barrier layer 2 and the electron barrier layer 4. FIG. 9 is a schematic diagram showing the image sensing panel according to an embodiment of the disclosure. Referring to FIG. 9, the hole barrier layer 2 and the photoconductive layer 3 stacked on each other are used in this embodiment, and the electron barrier layer 4 is omitted.

FIG. 10 is a schematic diagram showing the image sensing panel according to an embodiment of the disclosure. Referring to FIG. 10, as compared with the multi-layer structure of FIG. 2, the photoconductive layer 3 and the electron barrier layer 4 stacked on each other are used in this embodiment, and the hole barrier layer 2 is omitted.

The image sensing panel 10 according to the disclosure maintains collection of charges of the holes by at least one of the hole barrier layer 2 and the electron barrier layer 4, so as to form an image. In addition, electrons are more accurately detected by the automatic exposure detector. The automatic exposure detection is performed according to the feature pattern of the sensing signal generated by entry and absence of the X-ray, so as to effectively control the time of turning on the exposure.

What is claimed is:

1. A radiation image detector with capability of automatic exposure detection, comprising:
   a high voltage circuit unit providing an operation bias;
   an image sensing panel receiving the operation bias and sensing an incident X-ray, and generating holes and electrons, wherein the holes generate positive charges to form an image;
   an automatic exposure detector coupled to the high voltage circuit unit to transfer the operation bias and detecting a variation pattern with time of a sensing signal generated by the electrons, wherein a reference signal is internally generated dynamically varying with time for comparing with the sensing signal, and an onset time point for exposure is determined when the reference signal is greater than the sensing signal in a start stage, and an cessation time point for the exposure is determined when the sensing signal is greater than the reference signal in an exposure stage;
   a control unit coupled to the high voltage circuit unit, the image sensing panel, and the automatic exposure detector and configured to perform a system control, comprising obtaining an image signal of the image from the image sensing panel; and
   an imaging unit coupled to the control unit and receiving the image signal of the image to process the image signal and display and store the image.

2. The radiation image detector according to claim 1, wherein the image sensing panel comprises:
   a substrate comprising a lower electrode layer and a sensing circuit, wherein the lower electrode layer receives a ground voltage of the operation bias, and the sensing circuit comprises a plurality of pixels respectively receiving and converting the holes into electrical signals to be outputted to the control unit;
   an upper electrode layer receiving a positive voltage of the operation bias;
   a photoconductive layer sensing the incident X-ray and generating the holes and the electrons;
   a hole barrier layer disposed between the photoconductive layer and the upper electrode layer; and
   an electron barrier layer disposed between the photoconductive layer and the lower electrode layer.

3. The radiation image detector according to claim 2, wherein the hole barrier layer blocks the holes injected from the upper electrode layer and the electron barrier layer blocks the electrons injected from the lower electrode layer.

4. The radiation image detector according to claim 2, wherein a material of the hole barrier layer is an N-type tin oxide, a material of the photoconductive layer is a doped amorphous semiconductor, and a material of the electron barrier layer is a P-type tin oxide.

5. The radiation image detector according to claim 1, wherein the image sensing panel comprises:

a substrate comprising a lower electrode layer and a sensing circuit, wherein the lower electrode layer receives a ground voltage of the operation bias, and the sensing circuit comprises a plurality of pixels respectively receiving and converting the holes into electrical signals to be outputted to the control unit;

an upper electrode layer receiving a positive voltage of the operation bias;

a photoconductive layer sensing the incident X-ray and generating the holes and the electrons; and a hole barrier layer disposed between the photoconductive layer and the upper electrode layer.

6. The radiation image detector according to claim 5, wherein the hole barrier layer blocks the holes injected from the upper electrode layer.

7. The radiation image detector according to claim 5, wherein a material of the hole barrier layer is an N-type tin oxide and a material of the photoconductive layer is a doped amorphous semiconductor.

8. The radiation image detector according to claim 1, wherein the image sensing panel comprises:

a substrate comprising a lower electrode layer and a sensing circuit, wherein the lower electrode layer receives a ground voltage of the operation bias, and the sensing circuit comprises a plurality of pixels respectively receiving and converting the holes into electrical signals to be outputted to the control unit;

an upper electrode layer receiving a positive voltage of the operation bias;

a photoconductive layer sensing the incident X-ray and generating the holes and the electrons; and an electron barrier layer disposed between the photoconductive layer and the lower electrode layer.

9. The radiation image detector according to claim 8, wherein the electron barrier layer blocks the electrons injected from the lower electrode layer.

10. The radiation image detector according to claim 8, wherein a material of the photoconductive layer is a doped amorphous semiconductor and a material of the electron barrier layer is a P-type tin oxide.

11. The radiation image detector according to claim 1, wherein the automatic exposure detector comprises:

a current sensor receiving a high voltage that is inputted to transmit an operating voltage and outputting the sensing signal; and a control circuit receiving the sensing signal and internally generating the reference signal, wherein variances of the onset time point and the cessation time point are detected with time.

12. The radiation image detector according to claim 11, wherein the reference signal starts with a first initial value smaller than the sensing signal in the start stage and the reference signal is adjusted dynamically to be gradually close to the sensing signal according to a change varying with time of a first difference between the reference signal and the sensing signal.

13. The radiation image detector according to claim 12, wherein the onset time point is generated when the first difference has a negative increment greater than a predetermined value in a predetermined observation time.

14. The radiation image detector according to claim 12, wherein the onset time point is determined when a falling rate of the sensing signal is greater than a predetermined falling rate.

15. The radiation image detector according to claim 12, wherein the reference signal starts with a second initial value greater than the sensing signal in the exposure stage and the reference signal is adjusted dynamically to be gradually close to the sensing signal according to a change varying with time of a second difference between the reference signal and the sensing signal.

16. The radiation image detector according to claim 15, wherein the cessation time point is generated when the second difference has a negative increment greater than a predetermined value in a predetermined observation time.

17. The radiation image detector according to claim 15, wherein the cessation time point is determined when a rising rate of the sensing signal is greater than a predetermined rising rate.

18. The radiation image detector according to claim 11, wherein the automatic exposure detector also communicates with the control unit, and when the control unit tracks the sensing signal and detects that when a safe region is exceeded, the control unit sends a stop signal to an X-ray source to end exposure.

19. An automatic exposure detection method adapted for a radiation image detector, which comprises: an image sensing panel receiving an operation bias and sensing an incident X-ray to generate holes and electrons, wherein the holes generate positive charges to form an image; and an automatic exposure detector determining an onset time point and a cessation time point for exposure according to the automatic exposure detection method, the automatic exposure detection method comprising:

receiving a high voltage that is inputted to transmit the high voltage to the image sensing panel, and outputting a sensing signal by a current sensor; and receiving the sensing signal and internally generating a reference signal dynamically varying with time by a control circuit, wherein the reference signal comprises a start stage and an exposure stage, wherein the onset time point for the exposure are determined when the reference signal is greater than the sensing signal in the start stage, the cessation time point for the exposure is determined when the sensing signal is greater than the reference signal in the exposure stage.

20. The automatic exposure detection method according to claim 19, wherein the reference signal starts with a first initial value smaller than the sensing signal in the start stage and the reference signal is adjusted dynamically to be gradually close to the sensing signal according to a change varying with time of a first difference between the reference signal and the sensing signal.

21. The automatic exposure detection method according to claim 20, wherein the onset time point is generated when the first difference has a negative increment greater than a predetermined value in a predetermined observation time.

22. The automatic exposure detection method according to claim 20, wherein the onset time point is determined when a falling rate of the sensing signal is greater than a predetermined falling rate.

23. The automatic exposure detection method according to claim 20, wherein the reference signal starts with a second initial value greater than the sensing signal in the exposure stage and the reference signal is adjusted dynamically to be gradually close to the sensing signal according to a change varying with time of a second difference between the reference signal and the sensing signal.

24. The automatic exposure detection method according to claim 23, wherein the cessation time point is generated when the second difference has a negative increment greater than a predetermined value in a predetermined observation time.

25. The automatic exposure detection method according to claim 23, wherein the cessation time point is determined when a rising rate of the sensing signal is greater than a predetermined rising rate.

26. The automatic exposure detection method according to claim 19, wherein the automatic exposure detector also communicates with the control unit, and when the control unit tracks the sensing signal and detects that when a safe region is exceeded, the control unit sends a stop signal to an X-ray source to end exposure.

27. The automatic exposure detection method according to claim 19, wherein in an update cycle of the start stage, a process of dynamically generating the reference signal comprises:

calculating a plurality of parameters, comprising reading and digitizing the sensing signal at a sampling time point;

calculating a mean ($\mu$) and a standard deviation ($\sigma$) of the sensing signal at an estimated number of the sampling points by a statistical method, wherein a background level ($Q_B$) is updated according to the mean ($\mu$) and a falling rate ($R_F$) of the reference signal is calculated;

determining if the falling rate ($R_F$) meets a reference signal compensation condition, namely, the falling rate ($R_F$) is smaller than or equal to a reference falling rate ($R_{FS}$) ($R_F \leq R_{FS}$), before the onset time point for exposure is reached, and exiting the process if a result is "NO", and continuing with a reference signal compensation process below if the result is "YES";

calculating a current difference D, wherein D=($\mu-\sigma$)−$D_{REF}$, and the $D_{REF}$ is a current reference value;

examining a condition of D$\geq Z_{SAFE}$, wherein the $Z_{SAFE}$ is a safe guard region;

if the condition of D$\geq Z_{SAFE}$ is "YES", updating the $D_{REF}$ based on the $Z_{SAFE}$;

if the condition of D$\geq Z_{SAFE}$ is "NO", updating the $D_{REF}$ based on the ($\mu-\sigma$);

obtaining the $D_{REF}$ that has been updated; and updating the reference signal $V_{REF}$ according to the $D_{REF}$.

28. The automatic exposure detection method according to claim 19, wherein in an update cycle after the start stage, a process of dynamically generating the reference signal comprises:

calculating a plurality of parameters, comprising reading and digitizing the sensing signal at a sampling time point;

calculating a mean ($\mu$) and a standard deviation ($\sigma$) of the sensing signal at a plurality of the sampling points by a statistical method, calculating a reference value ($\mu+\sigma$), and updating a background level ($Q_B$) according to the mean ($\mu$);

accumulating ($\mu-Q_B$) to obtain a total charge amount $Q_T$;

examining $Q_S \leq Q_T$, wherein the X-ray is stopped if $Q_S \leq Q_T$, or a following process is performed;

calculating a rising rate ($R_S$) of the sensing signal;

determining if the rising rate ($R_S$) meets a reference signal compensation condition, namely, the rising rate ($R_S$) is smaller than or equal to a reference falling rate ($R_{FS}$) ($R_S \leq R_{RS}$), before the cessation time point for exposure is reached, and exiting the process if a result is "NO", and continuing with a reference signal compensation process below if the result is "YES";

calculating a current difference D, wherein D=$D_{REF}$−($\mu+\sigma$), and the $D_{REF}$ is a current reference value;

examining a condition of D$\geq Z_{SAFE}$, wherein the $Z_{SAFE}$ is a safe guard region;

if the condition of D$\geq Z_{SAFE}$ is "YES", updating the $D_{REF}$ based on the $Z_{SAFE}$;

if the condition of D$\geq Z_{SAFE}$ is "NO", updating the $D_{REF}$ based on the ($\mu+\sigma$);

obtaining the $D_{REF}$ that has been updated; and updating the reference signal $V_{REF}$ according to the $D_{REF}$.

* * * * *